United States Patent
Zhang et al.

(10) Patent No.: US 10,042,245 B2
(45) Date of Patent: Aug. 7, 2018

(54) PHOTOMASK HAVING AN EXPOSURE CORRECTION FUNCTION

(71) Applicant: Wuhan China Star Optoelectronics Technology Co., Ltd., Wuhan (CN)

(72) Inventors: Chunqian Zhang, Wuhan (CN); Caiqin Chen, Wuhan (CN); Chao Wang, Wuhan (CN); Qipei Zhang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 15/322,174

(22) PCT Filed: Aug. 3, 2016

(86) PCT No.: PCT/CN2016/093069
§ 371 (c)(1),
(2) Date: Dec. 27, 2016

(87) PCT Pub. No.: WO2018/010228
PCT Pub. Date: Jan. 18, 2018

(65) Prior Publication Data
US 2018/0017859 A1    Jan. 18, 2018

(30) Foreign Application Priority Data
Jul. 13, 2016   (CN) .......................... 2016 1 0547768

(51) Int. Cl.
*G03F 1/36*    (2012.01)

(52) U.S. Cl.
CPC ..................................... *G03F 1/36* (2013.01)

(58) Field of Classification Search
CPC ......................................................... G03F 1/36
USPC ............................................................. 430/5
See application file for complete search history.

(56) References Cited

U.S. PATENT DOCUMENTS

| | | | |
|---|---|---|---|
| 5,707,765 A | 1/1998 | Chen | |
| 6,044,007 A | 3/2000 | Capodieci | |
| 2003/0162103 A1 | 8/2003 | Oshima et al. | |
| 2006/0105249 A1 | 5/2006 | Kushida et al. | |
| 2010/0275176 A1 | 10/2010 | Abrams et al. | |
| 2012/0169983 A1* | 7/2012 | Ko ................... | G02F 1/134363 349/139 |

FOREIGN PATENT DOCUMENTS

| | | |
|---|---|---|
| CN | 1858884 | 11/2006 |
| CN | 101297390 | 10/2008 |
| JP | 2004-093705 | 3/2004 |

OTHER PUBLICATIONS

Notification of Office Action and Search Report dated May 25, 2017 From the State Intellectual Property Office of the People's Republic of China Re. Application No. 201610547768.X. (5 Pages).

* cited by examiner

*Primary Examiner* — John A McPherson

(57) ABSTRACT

A photomask having an exposure correction includes a shading region and an exposure region enclosed by the shading region. The exposure region comprises a correction sub-region and an exposure sub-region. The correction sub-region is arranged along two edges of an acute angle of the exposure region from an acute angle vertex of the exposure region.

4 Claims, 4 Drawing Sheets

PHOTOMASK HAVING AN EXPOSURE CORRECTION FUNCTION

RELATED APPLICATIONS

This application is a National Phase of PCT Patent Application No. PCT/CN2016/093069 having International filing date of Aug. 3, 2016, which claims the benefit of priority of Chinese Patent Application No. 201610547768.X filed on Jul. 13, 2016. The contents of the above applications are all incorporated by reference as if fully set forth herein in their entirety.

FIELD AND BACKGROUND OF THE INVENTION

The present disclosure relates to the field of liquid crystal displays, and more particularly to a photomask having an exposure correction function.

Currently, liquid crystal displays (LCDs) are widely used in electronic displays, such as televisions, computer screens, notebook computers, and mobile telephones.

In the LCDs, in order to ensure deflection angle of liquid crystals, intensity of an electric field formed in a panel needs to be ensured. However, in a fringe field switching (FFS) mode, the electric field is at a horizontal arrangement, thus there is more need to ensure exposure accuracy of a pixel electrode, where further uniform electric field is used to make deflection of the liquid crystals uniform.

In manufacturing a photomask, when size of a pattern on the photomask is less than a minimum accuracy of an exposure machine, the pattern cannot be completely copied because of limited exposure accuracy. It is assumed that if the pattern of the photomask has an acute angle, after an exposure and etching process is performed, the pattern of the photomask forms a round corner instead. If the above photomask is used, the electric field is non-uniform, which effects deflection of the liquid crystals, further forming dark lanes, and affecting display quality and display.

Therefore, it is necessary to provide a photomask to solve the above issue of the prior art.

SUMMARY OF THE INVENTION

In order to avoid that the pattern cannot be completely copied because of limited exposure accuracy, the present disclosure provides a photomask having an exposure correction function.

The present disclosure provides the photomask having the exposure correction function, where the photomask having the exposure correction function, comprises a shading region and an exposure region enclosed by the shading region.

The exposure region comprises an exposure sub-region and a correction sub-region.

The correction sub-region is arranged along two edges of an acute angle of the exposure region from an acute angle vertex of the exposure region. The correction sub-region is connected with the exposure sub-region. Upon a condition that the correction sub-region is a sawtooth wave region, a maximum height of each sawtooth of the sawtooth wave region is less than a minimum exposure accuracy of an exposure machine. The sawtooth of the sawtooth wave region are uniformly arranged along two edges of the acute angle from the acute angle vertex.

The present disclosure provides the photomask having the exposure correction function, where the photomask having the exposure correction function comprises a shading region and an exposure region enclosed by the shading region. The exposure region comprises a correction sub-region and an exposure sub-region, where the correction sub-region is arranged along two edges of an acute angle of the exposure region from the acute angle vertex of the exposure region. In a traditional photomask, an acute angle of the exposure sub-region performs an exposure and etching process, and the acute angle of the exposure sub-region forms round corner, which causes non-uniformity of an electric field and affect deflection of liquid crystals. Thus, through the correction sub-region is arranged along two edges of an acute angle of the exposure region from an acute angle vertex of the exposure region, size of the acute angle of the exposure sub-region is less than a minimum exposure accuracy of an exposure machine and size of the correction sub-region is less than the minimum exposure accuracy of the exposure machine, which avoids affecting exposure pattern. Namely, the diffracted light passed through a first edge of the acute angle and light passed through a second edge of the acute angle generate superposition and mutually enhance, which increases intensity of the light and ability of the exposure, further increasing the exposure accuracy, further desired pattern is obtained after an exposure and etching process is performed, and non-uniformity of the electric field is avoided. Thus, quality of liquid crystal products and display are improved.

In the photomask having the exposure correction function of the present disclosure, the correction sub-region is connected with the exposure sub-region. It is specific location of the correction sub-region.

In the photomask having the exposure correction function of the present disclosure, the correction sub-region comprises but not limited to a quasi-sawtooth wave region or a quasi-sinusoidal wave region.

In the photomask having the exposure correction function of the present disclosure, the correction sub-region is a sawtooth wave region, and a maximum height of each sawtooth of the sawtooth wave region is less than a minimum exposure accuracy of an exposure machine. Through shape and size of the correction sub-region are limited, correction is improved and display is improved.

In the photomask having the exposure correction function of the present disclosure, the sawtooth of the sawtooth wave region are uniformly arranged along the two edges of the acute angle from the acute angle vertex.

In the photomask having the exposure correction function of the present disclosure, the sawtooth of the sawtooth wave region gradually decrease along the two edges of the acute angle from the acute angle vertex. The sawtooth is closer to the acute angle vertex, size of the sawtooth is greater, thus, effect for enhancing light is more obvious. The sawtooth is further to the acute angle vertex, size of the sawtooth is less, thus, effect for enhancing light is less, which can uniformly improve intensity of the exposure, obtain the desired acute angle pattern, and improve display.

In the photomask having the exposure correction function of the present disclosure, the correction sub-region is a sinusoidal wave region, and a maximum crest of each sinusoidal wave of the sinusoidal wave region is less than a minimum exposure accuracy of an exposure machine. Through shape and size of the correction sub-region are limited, correction is improved and display is improved.

In the photomask having the exposure correction function of the present disclosure, the sinusoidal waves of the sinusoidal wave region are uniformly arranged along the two edges of the acute angle from the acute angle vertex.

In the photomask having the exposure correction function of the present disclosure, the sinusoidal waves of the sinusoidal wave region gradually decrease along the two edges of the acute angle from the acute angle vertex. The sinusoidal wave is closer to the acute angle vertex, amplitude of the sinusoidal wave is greater, thus, effect for enhancing light is more obvious. The sinusoidal wave is further to the acute angle vertex, amplitude of the sinusoidal wave is less, thus, effect for enhancing light is less, which can uniformly improve intensity of the exposure, obtain the desired acute angle pattern, and improve display.

The present disclosure provides the photomask having the exposure correction function, where the photomask having the exposure correction function comprises a shading region and an exposure region enclosed by the shading region.

The exposure region comprises a correction sub-region and an exposure sub-region.

The correction sub-region is arranged along two edges of an acute angle of the exposure region from an acute angle vertex of the exposure region. The shading region comprises a main region and an extension region, and the main region extending outward from the main region.

Compared with the prior art, the present disclosure provides the photomask having the exposure correction function to form at least a correction sub-region along two edges of the acute angle from the acute angle vertex. The correction sub-region replaces straight lines of the two edges of original acute angle to form the quasi-sawtooth wave region or the quasi-sinusoidal wave region. As size of the acute angle is less than the minimum exposure accuracy of the exposure machine and size of the correction sub-region is less than the minimum exposure accuracy of the exposure machine, which cannot affect exposure pattern. Namely, the diffracted light passed through a first edge of the acute angle and light passed through a second edge of the acute angle generate superposition and mutually enhance, which increases intensity of the light and ability of the exposure, further increasing the exposure accuracy, further desired pattern is obtained after an exposure and etching process is performed, and non-uniformity of the electric field is avoided. Thus, quality of liquid crystal products and display are improved.

BRIEF DESCRIPTION OF THE SEVERAL VIEWS OF THE DRAWINGS

In order to describe clearly the embodiment in the present invention or the prior art, the following will introduce the drawings for the embodiment shortly. Obviously, the following description is only a few embodiments, for the common technical personnel in the field it is easy to acquire some other drawings without creative work.

DESCRIPTION OF SPECIFIC EMBODIMENTS OF THE INVENTION

Figure 1:
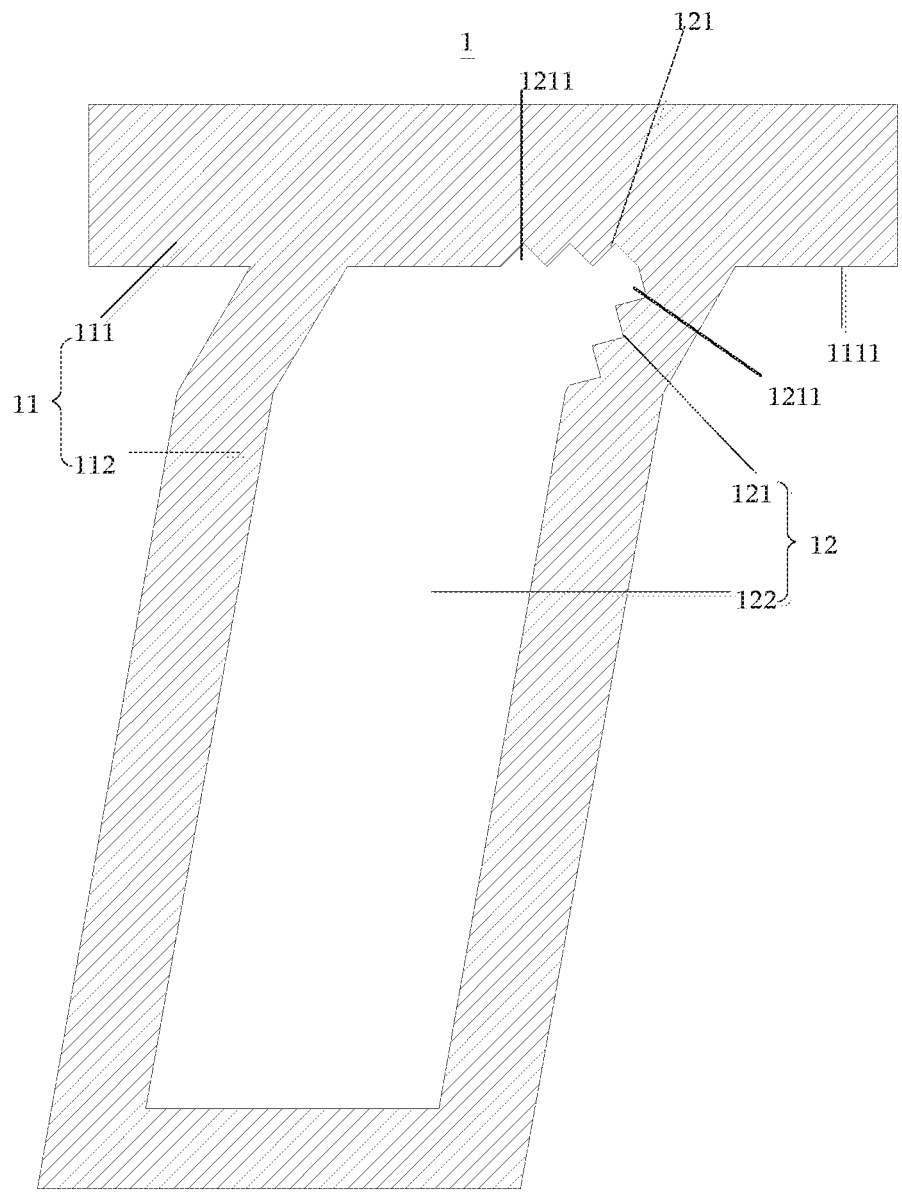
FIG. 1 is a structural diagram of a correction sub-region being a sawtooth wave region of a photomask of the present disclosure and sawtooth of the sawtooth wave region are uniformly arranged.

As shown in the drawings, wherein the same component symbols represent the same components. The following description is based on the specific illustrated embodiments of the present invention, which should not be construed as limiting the present invention, unless otherwise specified.

As shown in FIG. 1, FIG. 1 is a structural diagram of a photomask 1 having an exposure correction function of a preferable embodiment of the present disclosure. The photomask 1 comprises a shading region 11 and an exposure region 12, where the exposure region 12 is enclosed by the shading region 11. Dashed region in the drawings is the shading region 11, and a blank region in the drawings is the exposure region 12.

To be specific, the shading region 11 comprises a main region 111 and an extension region 112 extending outward from the main region. In the embodiment, the main region 111 is rectangular. The main region 111 comprises a bottom edge 1111. It should be understood that shape of the main region 111 is adjusted according to actual requirements in other embodiments, such as a square and a polygon.

In the embodiment, the extension region 112 obliquely extends from the bottom edge 1111 of the main region 111, where the extension region 112 is approximately a U-shaped structure. In the embodiment, a head and a tail of the extension region 112 are connected with the bottom edge 1111 of the main region 111 to form the exposure region 12. It should be understood that number and shape of the extension region are adjusted according to actual requirements in other embodiments, as long as the extension region can be matched with the main region 111 to form the exposure region 12.

The exposure region 12 comprises an exposure sub-region 122 and a correction sub-region 121. To be specific, in the embodiment, the exposure sub-region 122 is approximately in the shape of a rhombus. Namely, the extension region 112 is matched with the main region 111 to form the exposure region 12 that is approximately in the shape of the rhombus. The exposure region 12 is located in a critical position of the main region 111 connected to the extension region 112 to form at least an acute angle vertex region having an acute angle. The correction sub-region 121 is arranged along two edges of an acute angle from an acute angle vertex. The correction sub-region 121 is connected with the exposure sub-region 122.

Preferably, the correction sub-region comprises, but not limited to, a quasi-sawtooth wave region or a quasi-sinusoidal wave region.

In the embodiment, the correction sub-region 121 is a sawtooth wave region, where a maximum height of each sawtooth 1211 of the sawtooth wave region 121 is less than a minimum exposure accuracy of an exposure machine. When light passes through the sawtooth wave region the light generates diffraction, and the diffracted light passed through a first edge of the acute angle and light passed through a second edge of the acute angle generate superposition and mutually enhance, which increases intensity of the light and ability of the exposure, further increasing the exposure accuracy. The acute angle pattern still remains an acute angle pattern after an etching process is performed. The above correction sub-region has good correction, through experimentation, namely the acute angle pattern is better restored. To be specific, the sawtooth 1211 of the sawtooth wave region 121 are uniformly arranged, and each sawtooth is closely connected.

Figure 2:
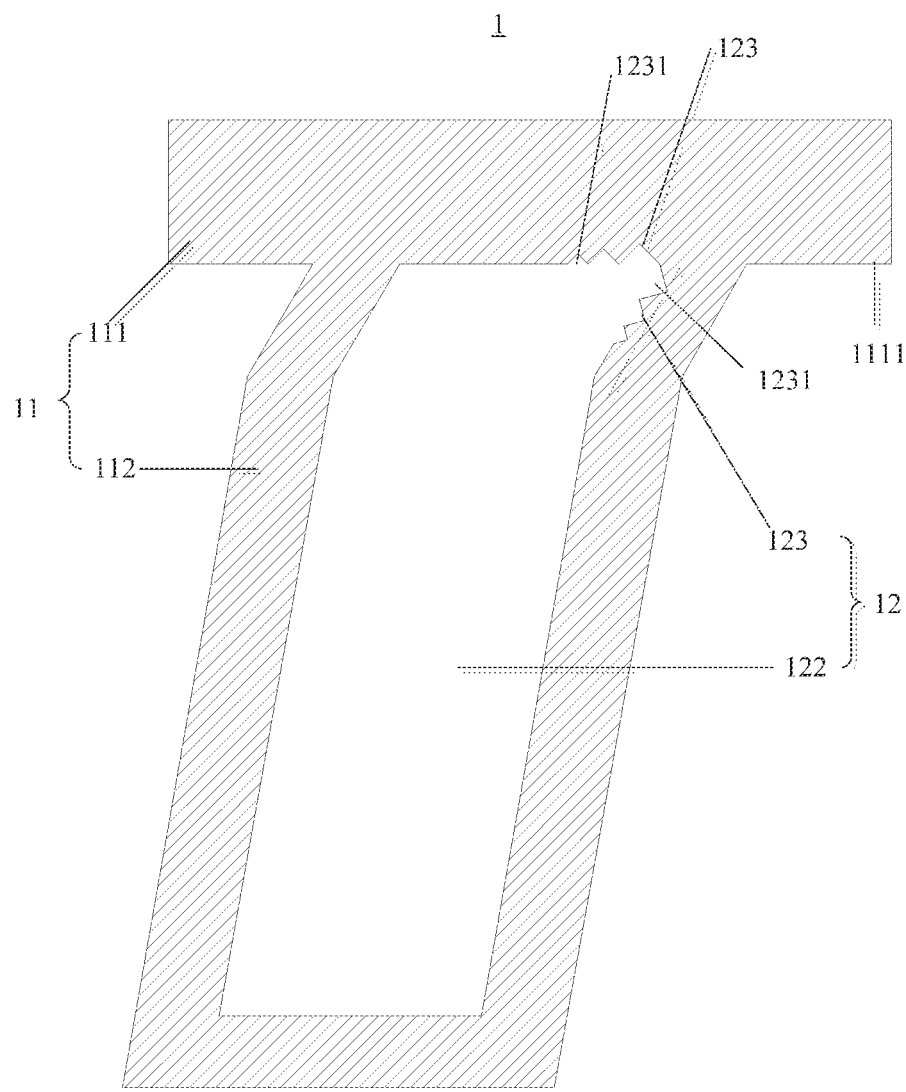
FIG. 2 is a structural diagram of a correction sub-region being a sawtooth wave region of a photomask of the present disclosure and sawtooth of the sawtooth wave region gradually decrease along two edges of an acute angle from an acute angle vertex.

As shown in FIG. 2 combined with FIG. 1, preferably, the sawtooth of the sawtooth wave region gradually decrease along two edges of an acute angle from an acute angle vertex in FIG. 2. The sawtooth is closer to the acute angle vertex, size of the sawtooth is greater, thus, effect for enhancing light is more obvious. The sawtooth is further to the acute angle vertex, size of the sawtooth is less, thus, effect for enhancing light is less, which can uniformly improve intensity of the exposure and restore the acute angle pattern.

Figure 3:
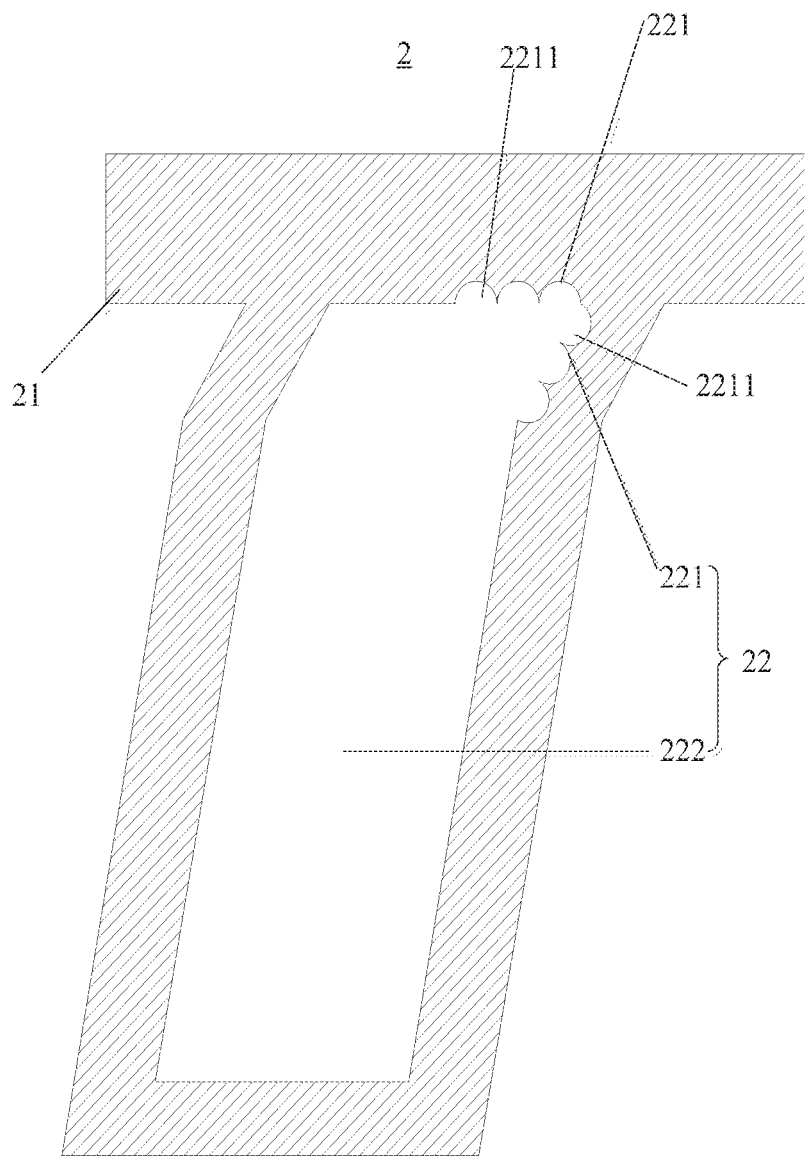
FIG. 3 is a structural diagram of a correction sub-region being a sinusoidal wave region of a photomask of the present disclosure and sinusoidal waves of the sawtooth wave region are uniformly arranged.

As shown in FIG. 3, FIG. 3 is a structural diagram of a photomask 2 having an exposure correction function of a preferable second embodiment of the present disclosure. The photomask 2 comprises a shading region 21 and an exposure region 22, where the exposure region 22 is enclosed by the shading region 21. Dashed region in drawings is the shading region 21, and a blank region in the drawings is the exposure region 22. The exposure region 22 comprises an exposure sub-region 222 and a correction sub-region 221. Basic structure of the photomask 2 is same as a structure of the photomask 1 of the first embodiment. The embodiment is a difference from the above embodiment in that the correction sub-region 221 is a sinusoidal wave region, where a maximum crest of each sinusoidal wave of the sinusoidal wave region 221 is less than the minimum exposure accuracy of the exposure machine. When light passes through the sinusoidal wave region, the light generates diffraction, the diffracted light passed through a first edge of the acute angle and light passed through a second edge of the acute angle generate superposition and mutually enhance, which increases intensity of the light and ability of the exposure, further increasing the exposure accuracy. The acute angle pattern still is the acute angle pattern after an etching process is performed. The above correction sub-region has good correction, through experimentation. Namely the acute angle pattern is better restored. To be specific, the sinusoidal waves 1211 of the sinusoidal wave region 121 are uniformly arranged, and each sinusoidal wave is closely connected.

Figure 4:
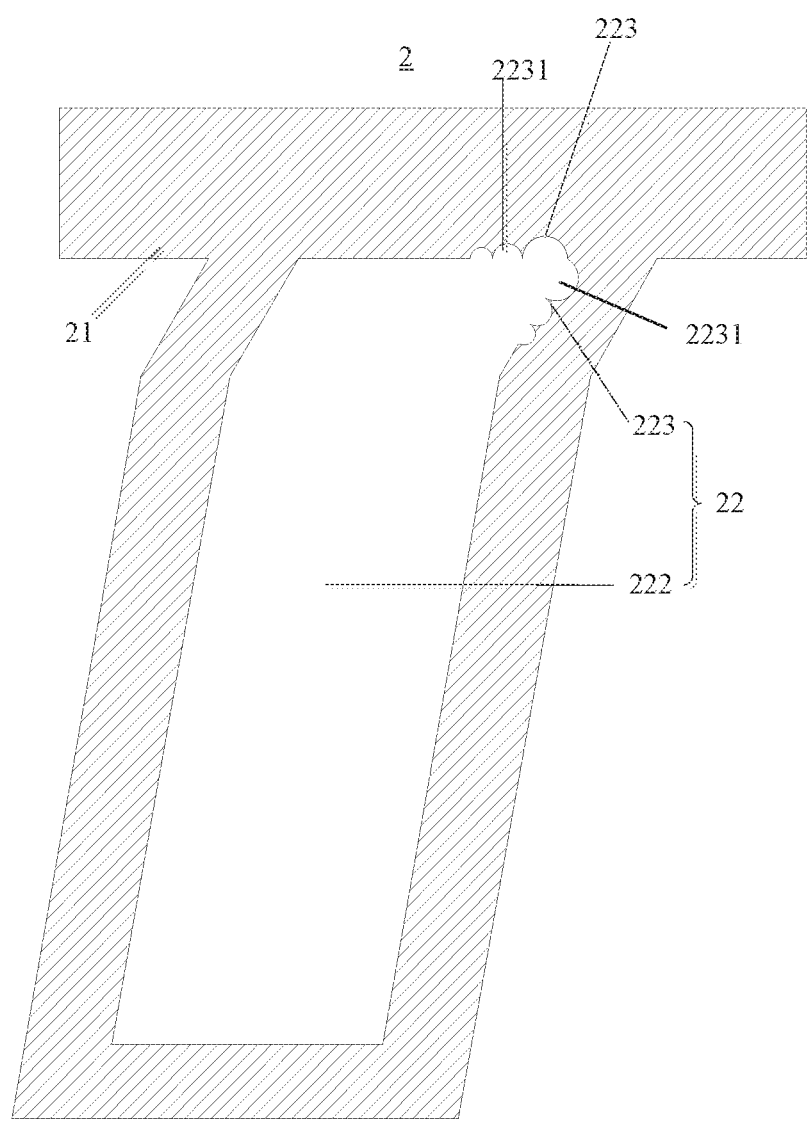
FIG. 4 is a structural diagram of a correction sub-region being a sinusoidal wave region of a photomask of the present disclosure where sinusoidal waves of the sinusoidal wave region gradually decrease along two edges of an acute angle from an acute angle vertex.

As shown in FIG. 4 combined with FIG. 3, preferably, the sinusoidal waves of the sinusoidal wave region gradually decrease along two edges of an acute angle from an acute angle vertex in FIG. 4. The sinusoidal wave is closer to the acute angle vertex, amplitude of the sinusoidal wave is greater, thus, effect for enhancing light is more obvious. The sinusoidal wave is further to the acute angle vertex, amplitude of the sinusoidal wave is less, thus, effect for enhancing light is less, which can uniformly improve intensity of the exposure, and the desired acute angle pattern is obtained.

It should be understood that designed shape of the correction sub-region is not limited in the shape of the above embodiment and can be other structure, and there are not one by one described.

Sizes of the sawtooth of the sawtooth wave region and the sinusoidal waves of the sinusoidal wave region are set by the exposure machine depending on wavelength of the light, location of light source and other conditions. For a person skilled in the art, it should be understood and calculated.

Compared with the prior art, the present disclosure provides the photomask having the exposure correction function to form at least a correction sub-region along two edges of the acute angle from the acute angle vertex. The correction sub-region replaces straight lines of the two edges of original acute angle to form the quasi-sawtooth wave region or the quasi-sinusoidal wave region. As size of the acute angle is less than the minimum exposure accuracy of the exposure machine and size of the correction sub-region is less than the minimum exposure accuracy of the exposure machine, which cannot affect exposure pattern. Namely, the diffracted light passed through a first edge of the acute angle and light passed through a second edge of the acute angle generate superposition and mutually enhance, which increases intensity of the light and ability of the exposure, further increasing the exposure accuracy, further desired pattern is obtained after an exposure and etching process is performed, and non-uniformity of the electric field is avoided. Thus, quality of liquid crystal products and display are improved.

It should be understood that the present disclosure has been described with reference to certain preferred and alternative embodiments which are intended to be exemplary only and do not limit the full scope of the present disclosure as set forth in the appended claims.

What is claimed is:

1. A photomask having an exposure correction function, comprising
   a shading region; and
   an exposure region enclosed by the shading region;
   wherein the exposure region comprises a correction sub-region and an exposure sub-region;
   wherein the correction sub-region is arranged along two edges of an acute angle of the exposure region from an acute angle vertex of the exposure region; the shading region comprises a main region and an extension region extending outward the main region; wherein the correction sub-region is connected with the exposure sub-region; the correction sub-region is a sawtooth wave region, and a maximum height of each sawtooth of the sawtooth wave region is less than a minimum exposure accuracy of an exposure machine; the sawtooth of the sawtooth wave region gradually decrease along the two edges of the acute angle from the acute angle vertex.

2. A photomask having an exposure correction function, comprising
   a shading region; and
   an exposure region enclosed by the shading region;
   wherein the exposure region comprises a correction sub-region and an exposure sub-region;
   wherein the correction sub-region is arranged along two edges of an acute angle of the exposure region from an acute angle vertex of the exposure region; wherein the correction sub-region is connected with the exposure sub-region; the correction sub-region is a sinusoidal wave region, and a maximum crest of each sinusoidal wave of the sinusoidal wave region is less than a minimum exposure accuracy of an exposure machine.

3. The photomask having the exposure correction function as claimed in claim 2, the sinusoidal waves of the sinusoidal wave region are uniformly arranged along the two edges of the acute angle from the acute angle vertex.

4. The photomask having the exposure correction function as claimed in claim 2, the sinusoidal waves of the sinusoidal wave region gradually decrease along the two edges of the acute angle from the acute angle vertex.

* * * * *